US012610507B2

(12) United States Patent
Zhang et al.

(10) Patent No.: US 12,610,507 B2
(45) Date of Patent: Apr. 21, 2026

(54) MOTHERBOARD PROTECTION CIRCUIT AND SERVER

(71) Applicant: Shenzhen Fulian Fugui Precision Industry Co., Ltd., Shenzhen (CN)

(72) Inventors: Lin Zhang, Shenzhen (CN); Ke-Feng You, Shenzhen (CN); Ying Li, Tianjin (CN)

(73) Assignee: Shenzhen Fulian Fugui Precision Industry Co., Ltd., Shenzhen (CN)

( * ) Notice: Subject to any disclaimer, the term of this patent is extended or adjusted under 35 U.S.C. 154(b) by 606 days.

(21) Appl. No.: 18/105,152

(22) Filed: Feb. 2, 2023

(65) Prior Publication Data

US 2023/0354561 A1    Nov. 2, 2023

(30) Foreign Application Priority Data

Apr. 29, 2022    (CN) .......................... 202210476474.8

(51) Int. Cl.
H05K 7/20                (2006.01)

(52) U.S. Cl.
CPC ..... H05K 7/20836 (2013.01); H05K 7/20136 (2013.01); H05K 7/20209 (2013.01); H05K 7/20718 (2013.01)

(58) Field of Classification Search
CPC .......... F04D 27/004; G06F 1/20; G06F 1/206; G06F 1/26; G06F 1/263; G06F 1/183; G06F 1/184; G06F 1/30; G06F 1/00; G06F 13/4282; H05K 7/20209; H05K 7/20836; H05K 7/20718; H05K 7/20136; H05K 7/20727; H05K 7/1487; H05K 7/1492; H05K 7/1498; H05K 7/20172
See application file for complete search history.

(56) References Cited

U.S. PATENT DOCUMENTS

| | | | | |
|---|---|---|---|---|
| 2014/0122753 A1* | 5/2014 | Chiu | ..................... | G06F 3/0604 |
| | | | | 710/74 |
| 2021/0072273 A1* | 3/2021 | Chien | ................... | F04D 27/001 |

FOREIGN PATENT DOCUMENTS

| | | |
|---|---|---|
| TW | M581641 U | 8/2019 |

* cited by examiner

*Primary Examiner* — Bryan R Perez
(74) *Attorney, Agent, or Firm* — ScienBiziP, P.C.

(57)        ABSTRACT

The present disclosure provides a motherboard protection circuit and a server. The motherboard protection circuit includes a baseboard management controller (BMC), a first connector and a first conversion circuit. The first connector outputs a first rotational speed signal when a fan is electrically connected to the first connector. The first conversion circuit is electrically connected between the BMC and the first connector, the first conversion circuit converts a first voltage of the first rotational speed signal into a second voltage and output a converted first rotational speed signal to the BMC. The BMC monitors a rotational speed of the fan according to the converted first rotational speed signal. The first conversion circuit maintains the voltage of the rotational speed signal to an ideal voltage, and outputs the rotational speed signal to the BMC, so that the BMC can normally receive the rotational speed signal.

20 Claims, 3 Drawing Sheets

MOTHERBOARD PROTECTION CIRCUIT AND SERVER

FIELD

The present disclosure relates to the field of server technology, in particular to a motherboard protection circuit and a server.

BACKGROUND

A baseboard management controller (BMC) can control the fan in the server to solve heat dissipation problems. The BMC outputs the pulse width modulation (PWM) signal to the fan. Different duty cycles of the PWM signal can control the fan to generate different rotation speeds. After receiving the PWM signal, the fan rotates at different rotation speeds, and outputs an actual rotational speed of the fan to the BMC. The BMC can control the speed of the fan according to the actual rotational speed signal. However, when the voltage of the rotational speed signal output by the fan is too small, the BMC may not be unable to receive the rotational speed signals normally, and make accurate adjustments.

Therefore, improvement is desired.

DETAILED DESCRIPTION

In the embodiment of the present disclosure, words such as "first" and "second" are only used to distinguish different objects and cannot be understood as indicating or implying relative importance or indicating or implying order. For example, the first application, the second application, and the like are used to distinguish different applications, not to describe the specific order of applications. The features defined as "first" and "second" can explicitly or implicitly include one or more of these features.

In the description of the embodiments of the present disclosure, the words "exemplary" or "for example" are used as examples, examples or descriptions. Any embodiment or design scheme described as "exemplary" or "for example" in the embodiments of the present disclosure shall not be interpreted as more preferred or advantageous than other embodiments or designs. Specifically, the use of words such as "exemplary" or "for example" is intended to present relevant concepts in a specific way.

The embodiment of the present disclosure provides a motherboard protection circuit and a server. The motherboard protection circuit can be applied to edge servers (or short chassis), or general rack servers (or long chassis). The servers can be edge servers (or short chassis), general rack servers (or long chassis).

Figure 1:
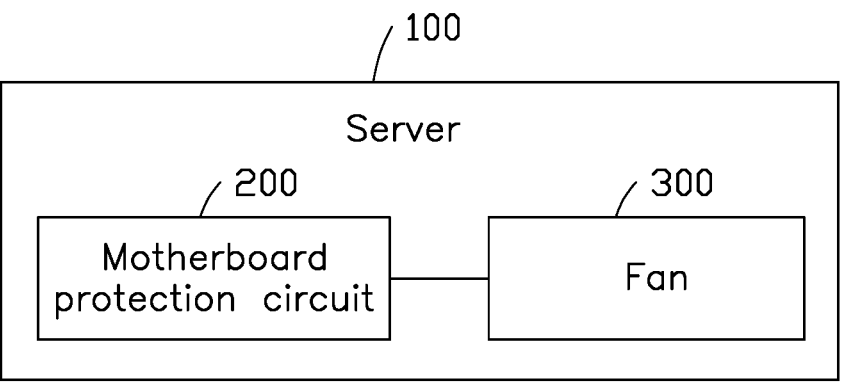
FIG. 1 is a schematic diagram of a server according to an embodiment of the present disclosure.

FIG. 1 illustrates a server 100 in accordance with an embodiment of the present disclosure.

The server 100 includes a motherboard protection circuit 200 and a fan 300. The motherboard protection circuit 200 is electrically connected to the fan 300. The motherboard protection circuit 200 is used to receive the rotational speed signal (FAN TACH signal) output by the fan 300 and monitor the state of the fan 300 according to the rotational speed signal, such as the rotational speed of the fan 300. The rotational speed signal is a square wave signal generated by the fan 300, and the rotational speed signal is used to feed back the rotational speed of the fan 300.

The fan 300 is disposed in the server 100. When the server 100 is running, it will emit a large amount of heat energy. The fan 300 can suck the cold air outside the server 100 into the server 100, let the cold air circulate inside, and then blow it out from the air outlet, so as to take away the heat from the internal parts of the server 100, and the server 100 can be cooled to ensure the maximum performance of the server 100.

Figure 2:
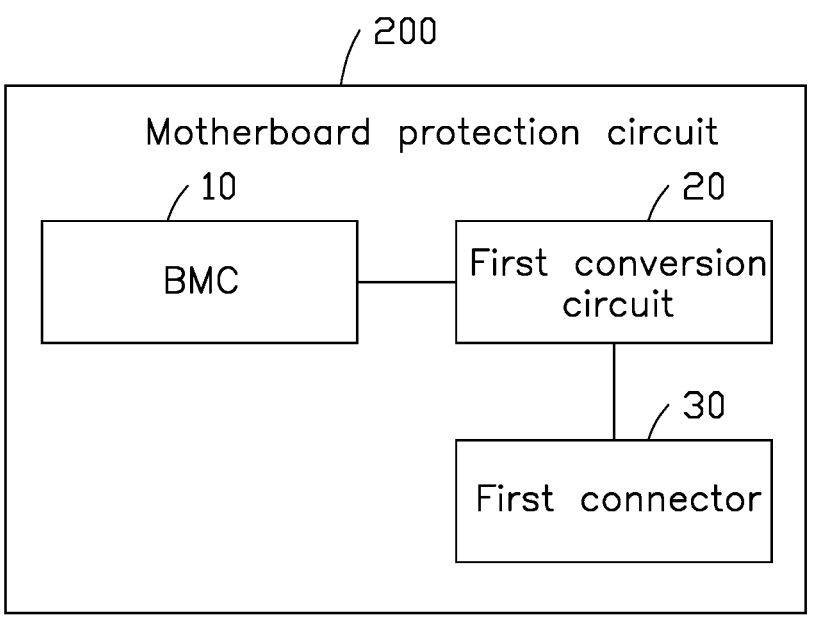
FIG. 2 is a schematic diagram of a motherboard protection circuit according to an embodiment of the present disclosure.

FIG. 2 illustrates a motherboard protection circuit 200 in accordance with an embodiment of the present disclosure.

As shown in FIG. 2, the motherboard protection circuit 200 includes a baseboard management controller (BMC) 10, a first conversion circuit 20 and a first connector 30.

When the first connector 30 is electrically connected to the fan 300, the first connector 30 is used to output the first rotational speed signal. The first conversion circuit 20 is electrically connected between the BMC 10 and the first connector 30 to convert the first voltage of the first rotational speed signal to the second voltage and output the converted first rotational speed signal to the BMC 10. The BMC 10 is used to monitor the rotational speed of the fan 300 according to the converted first rotational speed signal.

The BMC 10 is a special service processor, which can be used to measure the internal physical variables of the server 100, such as temperature, humidity, power voltage, fan speed, communication parameters and operating system functions, if these variables exceed the specified limits, an alarm will be issued. The BMC 10 monitors the rotational speed of the fan 300 according to the rotational speed signal, such as whether the rotational speed of the fan 300 is normal according to the rotational speed signal.

In the embodiment of the present disclosure, the receiving end of the BMC 10 is used for normal operation under ideal voltage, and the receiving end can receive signals of ideal voltage. If the voltage of the signal does not reach the ideal voltage, the receiving end of the BMC 10 cannot receive the signal normally. If the voltage of the signal exceeds the ideal voltage and reaches the threshold value, the signal may break down the receiving end of the BMC 10, thereby causing interference or even damage to the operation of the BMC 10.

In some embodiments, the receiving end of the BMC 10 can be a general-purpose input output (GPIO) port of the BMC 10.

In the embodiment, the first connector 30 is electrically connected to the fan 300, and the first connector 30 outputs the rotational speed signal of the fan 300.

Figure 3:
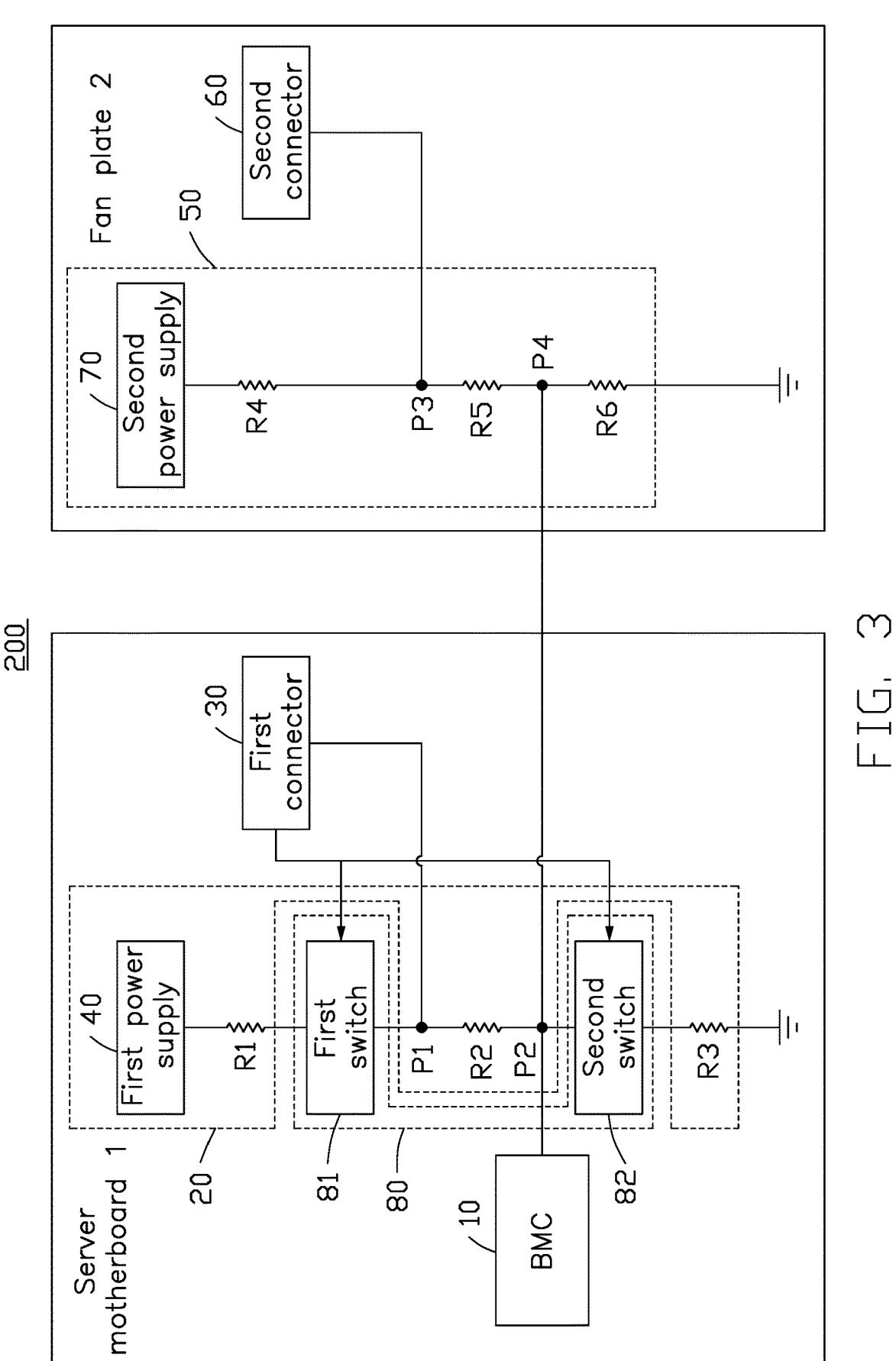
FIG. 3 is a circuit diagram of the motherboard protection circuit according to an embodiment of the present disclosure.

Referring to FIG. 3, the first conversion circuit 20 includes a first power supply 40, a first resistor R1, a second resistor R2 and a third resistor R3. The first power supply 40 is electrically connected to the second resistor R2 through the first resistor R1. The second resistor R2 is electrically connected to a constant voltage terminal through the third resistor R3. The first connector 30 is electrically connected to a first node P1 between the first resistor R1 and the second resistor R2. The first node P1 is electrically connected to the first connector 30, and the first node P1 is used to receive the first rotational speed signal output by the first connector 30. A second node P2 between the second resistor R2 and the third resistor R3 is electrically connected to the receiving end of the BMC 10, and the second node P2 is used to transmit the first rotational speed signal to the receiving end of the BMC 10.

In the embodiment of the present disclosure, the constant voltage terminal means that the voltage at the terminal is constant, the voltage at the constant voltage terminal can be 0V, and the constant voltage terminal can be ground.

The first power supply 40 can be used to provide 12V voltage, and the voltage provided by the first power supply 40 can be configured according to the specific circuit structure, which is not specifically limited in the embodiments of the present disclosure.

The first voltage of the first rotational speed signal output by the first connector 30 is too low, and the GPIO port of the BMC 10 can only receive a second voltage (such as 3.3V). The first conversion circuit 20 can change the first voltage of the first rotational speed signal into the second voltage (such as 3.3V), and the second node P2 transmits the first rotational speed signal of the second voltage to the BMC 10. For example, the first power supply 40 provides 12V voltage, the first power supply 40, the first resistor R1 and the second resistor R2 pull up the first voltage of the first rotational speed signal to 5V, and then divide the voltage through the third resistor R3 to reduce the voltage of the first rotational speed signal from 5V to 3.3V. The second node P2 transmits the first rotational speed signal which becomes 3.3V to the GPIO port of the BMC 10, and the BMC 10 can normally monitor the rotational speed of the fan 300 according to the first rotational speed signal.

In some embodiments, as shown in FIG. 3, the motherboard protection circuit 200 further includes a second conversion circuit 50 and a second connector 60. when the fan 300 is electrically connected to the second connector 60, and the second connector 60 is used to output a second rotational speed signal. The second conversion circuit 50 is electrically connected between the second node P2 and the second connector 60 to convert the first voltage of the second rotational speed signal into the second voltage and output the converted second rotational speed signal to the second node P2, to transmit the converted second rotational speed signal to the BMC 10 through the second node P2.

The second conversion circuit 50 includes a second power supply 70, a fourth resistor R4, a fifth resistor R5 and a sixth resistor R6. The second power supply 70 is electrically connected to the fifth resistor R5 through the fourth resistor R4, and the fifth resistor R5 is electrically connected to the constant voltage terminal through the sixth resistor R6. The second connector 60 is electrically connected to the third node P3 between the fourth resistor R4 and the fifth resistor R5, and the third node P3 is used to receive the second rotational speed signal. The fourth node P4 between the fifth resistor R5 and the sixth resistor R6 is used to transmit the converted second rotational speed signal to the second node P2, so that the second node P2 transmits the converted second rotational speed signal to the BMC 10.

The first voltage of the second rotational speed signal output by the second connector 60 is too low, and the GPIO port of the BMC 10 can only receive 3.3V (the second voltage). The second conversion circuit 50 can change the first voltage of the second rotational speed signal into a second voltage (such as 3.3V) and transmit the second rotational speed signal of the second voltage to the second node P2 by the fourth node P4, and then transmit it to the BMC 10 through the second node P2. For example, the second power supply 70 provides 12V voltage, the second power supply 70, the fourth resistor R4 and the fifth resistor R5 pull up the first voltage of the second rotational speed signal to 5V, and then divide the voltage through the sixth resistor R6 to reduce the voltage of the second rotational speed signal from 5V to 3.3V. The second rotational speed signal, which becomes 3.3V, is transmitted to the second node P2 through the fourth node P4. The GPIO port of the BMC can receive a 3.3V of the second rotational speed signal through the second node P2, and the BMC can normally monitor the rotational speed of the fan 300 according to the second rotational speed signal.

The second power supply 70 can be used to provide 12V voltage, and the voltage provided by the second power supply 70 can be configured according to the specific circuit structure, which is not specifically defined in the embodiments of the present disclosure.

The BMC 10, the first conversion circuit 20 and the first connector 30 can be disposed on the server motherboard 1, and the second conversion circuit 50 and the second connector 60 can be disposed on the fan plate 2.

The present disclosure can integrate the BMC 10, the first conversion circuit 20 and the first connector 30 on the server motherboard 1, which can solve the problem of space limitation of the edge server chassis. The BMC 10, the first conversion circuit 20, and the first connector 30 on the server motherboard 1 can monitor the rotational speed signal of the fan 300, reduce cable settings, and save costs.

In the embodiment of the present disclosure, the motherboard protection circuit 200 can be applied to different types of the servers 100. The motherboard protection circuit 200 includes the BMC 10, the first conversion circuit 20, the first connector 30 disposed on the server motherboard 1, and the second conversion circuit 50 and the second connector 60 disposed on the fan plate 2.

When the motherboard protection circuit 200 is applied to a non-edge server, insert the server motherboard 1 equipped with the BMC 10, the first conversion circuit 20 and the first connector into the edge server, the fan 300 set in the edge server is plugged into the first connector 30, and the fan 300 in the edge server outputs the first rotational speed signal through the first connector 30. The BMC 10 monitors the rotational speed of the fan 300 in the edge server according to the first rotational speed signal.

When the motherboard protection circuit 200 is applied to a non-edge server such as a general rack server (or a long chassis), the server motherboard 1 provided with the BMC 10, the first conversion circuit 20, and the first connector 30 is electrically connected to the fan plate 2 provided with the second conversion circuit 50 and the second connector 60 (for example, the second node P2 and the fourth node P4 are electrically connected through cables), the server motherboard 1 and fan plate 2 are plugged into the general rack server, and the fan 300 in the general rack server is plugged into the second connector 60, the fan 300 in the general rack server outputs a second rotational speed signal through the second connector 60. The BMC 10 monitors the rotational speed of the fan 300 in the general rack server according to the second rotational speed signal.

In the embodiment of the present disclosure, when the server motherboard 1 is electrically connected to the fan plate 2, the second node P2 is electrically connected to the fourth node P4, and the third resistor R3 forms a parallel resistance with the sixth resistor R6, which will reduce the ground impedance of the second node P2 and the fourth node P4, and the voltage of the second node P2 and the fourth node P4, leading to the low voltage of the second rotational speed signal transmitted by the second node P2 to the BMC 10, the receiving end of the BMC 10 could not normally receive the second rotational speed signal, causing a false judgment. Therefore, the motherboard protection circuit 200 provided by the embodiment of the present disclosure further includes a switch unit 80, the switch unit 80 is electrically connected to the first conversion circuit 20 and the first connector 30. The switch unit 80 is used for connecting or disconnecting the electrical connection between the first conversion circuit 20 and the BMC 10 according to the control signal when receiving the control signal of the first connector 30.

As shown in FIG. 3, the switch unit 80 includes a first switch 81 and a second switch 82. The first switch 81 is electrically connected between the first resistor R1 and the second resistor R2. The first switch 81 connects or disconnects the electrical connection between the first resistor R1 and the second resistor R2 according to the control signal. The second switch 82 is electrically connected between the second resistor R2 and the third resistor R3, and the second switch 82 connects or disconnects the electrical connection between the second resistor R2 and the third resistor R3 according to the control signal.

In some embodiments, the control signal can be an in-place signal (such as PRSNT signal). For example, the first connector 30 outputs a high level in place signal by default. When the fan 300 is electrically connected to the first connector 30, the in-place signal output by the first connector 30 changes from high level to low level. When the fan 300 is not electrically connected to the first connector 30, the in-place signal output by the first connector 30 changes from low level to high level.

In some embodiments, the first switch 81 is electrically connected between the first resistor R1 and the first node P1.

In some embodiments, the second switch 82 is electrically connected between the third resistor R3 and the second node P2.

In the embodiment of the present disclosure, the first switch 81 and the second switch 82 can be electronic switches, such as MOS tubes. The first switch 81 and the second switch 82 are turned off by default.

In the embodiment of the present disclosure, when the first switch 81 receives the in-place signal at low-level, the first switch 81 turns on the electrical connection between the first resistor R1 and the second resistor R2 or turns on the electrical connection between the first resistor R1 and the first node P1. When the first switch 81 receives the in-place signal at high level, the first switch 81 defaults to disconnect the electrical connection between the first resistor R1 and the second resistor R2 or disconnect the electrical connection between the first resistor R1 and the first node P1. When the second switch 82 receives the in-place signal at low level, the second switch 82 turns on the electrical connection between the second resistor R2 and the third resistor R3 or turns on the electrical connection between the third resistor R3 and the second node P2. When the second switch 82 receives the in-place signal at high level, the second switch 82 will disconnect the electrical connection between the second resistor R2 and the third resistor R3 by default or disconnect the electrical connection between the second resistor R2 and the second node P2 by default.

The working principle of the motherboard protection circuit 200 provided by the embodiment of the present disclosure is briefly described below:

If the motherboard protection circuit 200 is applied to the edge server, the first connector and the fan 300 in the edge server are plugged into the first connector 30, and the fan 300 in the edge server is electrically connected to the first connector 30, the in-place signal output by the first connector 30 changes from high level to low level, and the first switch 81 and the second switch 82 receive the in-place signal at low level. The first switch 81 connects the electrical connection between the first power supply 40 and the first resistor R1, and the second switch 82 connects the electrical connection between the second resistor R2 and the third resistor R3. The first rotational speed signal is pulled up by the first power supply 40, the first resistor R1 and the second resistor R2, this prevent the receiving end of the BMC 10 from failing to receive the first rotational speed signal and causing false judgment due to the first voltage of the first rotational speed signal output by the fan 300 is too small. The voltage of the first rotational speed signal is maintained at the second voltage through the third resistor R3, so as to avoid the breakdown of the receiving end of the BMC 10 due to the high voltage of the first rotational speed signal after pull-up, thus causing interference or even damage to the work of the BMC 10.

If the motherboard protection circuit 200 is applied to the general rack server, the second node P2 is electrically connected to the fourth node P4, and the first conversion circuit 20 is electrically connected to the second conversion circuit 50. The fan 300 of the general rack server is plugged into the second connector 60, the second connector 60 is electrically connected to the fan 300 of the general rack server, and the second connector 60 outputs the second rotational speed signal. The Fan 300 is not plugged into the first connector 30, the in-place signal output by the first connector 30 changes from low level to high level, and the first connector 30 outputs the in-place signal at high level to the first switch 81 and the second switch 82. The first switch 81 disconnects the electrical connection between the first power supply 40 and the first resistor R1, and the first power supply 40 cannot be electrically connected to the fourth node P4 through the second node P2 to avoid damage to the server motherboard 1 caused by the electrical connection between the first power supply 40 and the second power supply 70. The second switch 82 disconnects the electrical connection between the second node P2 and the third resistor R3, the third resistor R3 and the sixth resistor R6 cannot form a parallel resistance, the voltage between the second node P2 and the fourth node P4 will not be pulled down. Thus, the fourth node P4 transmits the second rotational speed signal maintaining the second voltage to the second node P2 and transmits the second rotational speed signal to the BMC 10 through the second node P2. This can prevent the receiving end of the BMC 10 from failing to receive signals and causing false judgment due to the second node P2 voltage is pulled down by the parallel resistance composed of the third resistor R3 and the sixth resistor R6.

In the embodiment of the present disclosure, the BMC 10 can identify the current rotational speed signal type according to the high and low levels of the in-place signal, and then can determine the server 100 currently accessed. For example, the BMC 10 can acquire the in-place signal, if the BMC detects that the in-place signal is low, it can determine that the currently received rotational speed signal is the rotational speed signal output by the fan 300 in the edge server. If the in-place signal is high level, it can be determined that the in-place signal speed signal currently received is the in-place signal speed signal output by the fan 300 in the general rack server.

Those of ordinary skill in the art should realize that the above embodiments are only used to illustrate the present disclosure, but not to limit the present disclosure. As long as they are within the essential spirit of the present disclosure, the above embodiments are appropriately made and changes fall within the scope of protection of the present disclosure.

What is claimed is:

1. A motherboard protection circuit comprising:
a baseboard management controller (BMC);
a first connector configured to output a first rotational speed signal when a fan is electrically connected to the first connector; and
a first conversion circuit electrically connected between the BMC and the first connector, the first conversion circuit being configured to convert a first voltage of the first rotational speed signal into a second voltage, and output a converted first rotational speed signal to the BMC;
wherein the BMC is configured to monitor a rotational speed of the fan according to the converted first rotational speed signal.

2. The motherboard protection circuit of claim 1, further comprising a switch unit, wherein the switch unit is electrically connected to the first conversion circuit and the first connector, the switch unit is configured to receive a control signal of the first connector and connect or disconnect electrical connection between the first conversion circuit and the BMC according to the control signal.

3. The motherboard protection circuit of claim 2, wherein the first conversion circuit comprises a first power supply, a first resistor, a second resistor and a third resistor; the first power supply is electrically connected to the second resistor through the first resistor, and the second resistor is electrically connected to a constant voltage terminal through the third resistor; the first connector is electrically connected to a first node between the first resistor and the second resistor, and the first node is configured to receive the first rotational speed signal; and a second node between the second resistor and the third resistor is configured to transmit the converted first rotational speed signal to the BMC.

4. The motherboard protection circuit of claim 3, wherein the switch unit comprises a first switch and a second switch, the first switch is electrically connected between the first resistor and the second resistor, and the first switch connects or disconnects electrical connection between the first resistor and the second resistor according to the control signal; the second switch is electrically connected between the second resistor and the third resistor, and the second switch connects or disconnects electrical connection between the second resistor and the third resistor according to the control signal.

5. The motherboard protection circuit of claim 4, wherein the first switch is electrically connected between the first resistor and the first node.

6. The motherboard protection circuit of claim 4, wherein the second switch is electrically connected between the third resistor and the second node.

7. The motherboard protection circuit of claim 3, further comprising a second conversion circuit and a second connector, wherein the second connector is configured to output a second rotational speed signal when the fan is electrically connected to the second connector; the second conversion circuit is electrically connected between the second node and the second connector, the second conversion circuit is configured to convert a first voltage of the second rotational speed signal into a second voltage, and output a converted second rotational speed signal to the second node.

8. The motherboard protection circuit of claim 7, wherein the second conversion circuit comprises a second power supply, a fourth resistor, a fifth resistor and a sixth resistor; the second power supply is electrically connected to the fifth resistor through the fourth resistor, and the fifth resistor is electrically connected to the constant voltage terminal through the sixth resistor; the second connector is electrically connected to a third node between the fourth resistor and the fifth resistor, and the third node is configured to receive the second rotational speed signal; a fourth node between the fifth resistor and the sixth resistor is configured to transmit the converted second rotational speed signal to the second node, thereby transmitting the converted second rotational speed signal to the BMC through the second node.

9. The motherboard protection circuit of claim 7, wherein the BMC, the first conversion circuit and the first connector are arranged on a server motherboard.

10. The motherboard protection circuit of claim 7, wherein the second conversion circuit and the second connector are arranged on a fan plate.

11. A server comprising:
a fan;
a motherboard protection circuit configured to obtain a rotational speed signal output by the fan and monitor a rotational speed of the fan according to the rotational speed signal, and the motherboard protection circuit comprising:
a baseboard management controller (BMC);
a first connector configured to output a first rotational speed signal when a fan is electrically connected to the first connector; and
a first conversion circuit electrically connected between the BMC and the first connector, the first conversion circuit being configured to convert a first voltage of the first rotational speed signal into a second voltage, and output a converted first rotational speed signal to the BMC;
wherein the BMC is configured to monitor a rotational speed of the fan according to the converted first rotational speed signal.

12. The server of claim 11, further comprising a switch unit, wherein the switch unit is electrically connected to the first conversion circuit and the first connector, the switch unit is configured to receive a control signal of the first connector and connect or disconnect electrical connection between the first conversion circuit and the BMC according to the control signal.

13. The server of claim 12, wherein the first conversion circuit comprises a first power supply, a first resistor, a second resistor and a third resistor; the first power supply is electrically connected to the second resistor through the first resistor, and the second resistor is electrically connected to a constant voltage terminal through the third resistor; the first connector is electrically connected to a first node between the first resistor and the second resistor, and the first node is configured to receive the first rotational speed signal; and a second node between the second resistor and the third resistor is configured to transmit the converted first rotational speed signal to the BMC.

14. The server of claim 13, wherein the switch unit comprises a first switch and a second switch, the first switch is electrically connected between the first resistor and the second resistor, and the first switch connects or disconnects electrical connection between the first resistor and the second resistor according to the control signal; the second switch is electrically connected between the second resistor and the third resistor, and the second switch connects or disconnects electrical connection between the second resistor and the third resistor according to the control signal.

15. The server of claim 14, wherein the first switch is electrically connected between the first resistor and the first node.

16. The server of claim 14, wherein the second switch is electrically connected between the third resistor and the second node.

17. The server of claim 13, further comprising a second conversion circuit and a second connector, wherein the second connector is configured to output a second rotational speed signal when the fan is electrically connected to the second connector; the second conversion circuit is electrically connected between the second node and the second connector, the second conversion circuit is configured to convert a first voltage of the second rotational speed signal into a second voltage, and output a converted second rotational speed signal to the second node.

18. The server of claim 17, wherein the second conversion circuit comprises a second power supply, a fourth resistor, a fifth resistor and a sixth resistor; the second power supply is electrically connected to the fifth resistor through the fourth resistor, and the fifth resistor is electrically connected to the constant voltage terminal through the sixth resistor; the second connector is electrically connected to a third node between the fourth resistor and the fifth resistor, and the third node is configured to receive the second rotational speed signal; a fourth node between the fifth resistor and the sixth resistor is configured to transmit the converted second rotational speed signal to the second node, thereby transmitting the converted second rotational speed signal to the BMC through the second node.

19. The server of claim 17, wherein the BMC, the first conversion circuit and the first connector are arranged on a server motherboard.

20. The server of claim 17, wherein the second conversion circuit and the second connector are arranged on a fan plate.

*  *  *  *  *